United States Patent [19]
van de Plassche

[11] 4,325,054
[45] Apr. 13, 1982

[54] FOLDING CIRCUIT FOR AN ANALOG-TO-DIGITAL CONVERTER

[75] Inventor: Rudy J. van de Plassche, Eindhoven, Netherlands

[73] Assignee: U.S. Philips Corporation, New York, N.Y.

[21] Appl. No.: 62,253

[22] Filed: Jul. 30, 1979

[30] Foreign Application Priority Data

Aug. 29, 1978 [NL] Netherlands .......................... 7808871

[51] Int. Cl.³ ............................................ H03K 13/02
[52] U.S. Cl. .............................. 340/347 AD; 328/183; 340/347 M
[58] Field of Search ....................... 364/852, 858, 608; 340/347 M, 347 AD, ; 307/228; 328/183

[56] References Cited

U.S. PATENT DOCUMENTS

| | | | |
|---|---|---|---|
| 3,021,517 | 2/1962 | Kaenel | 340/347 AD |
| 3,178,700 | 4/1965 | Kaenel | 340/347 AD |
| 3,587,089 | 6/1971 | Elliott | 340/347 AD |
| 4,005,410 | 1/1977 | Michael et al. | 340/347 AD |

*Primary Examiner*—Thomas J. Sloyan
*Attorney, Agent, or Firm*—Thomas A. Briody; William J. Streeter; Edward W. Goodman

[57] ABSTRACT

In a folding circuit of an analog-to-digital converter a chain of emitters of transistors which are interconnected by threshold elements and fed by direct current sources are used to reduce the distortion. The circuit is controlled by a current source which produces the input signal.

1 Claim, 4 Drawing Figures

FOLDING CIRCUIT FOR AN ANALOG-TO-DIGITAL CONVERTER

BACKGROUND OF THE INVENTION

The invention relates to a folding circuit for an analog-to digital converter for converting a monotonously increasing input signal to a certain value thereof into a monotonously increasing or decreasing output signal and, above that value, into a monotonously decreasing or increasing output signal, the folding circuit comprising a first and a second transistor to which the input signal is applied in operation and whose emitters are fed by a first and a second d.c. current source, respectively, and from whose collectors the output signal is obtained by means of a difference-producing circuit.

IEEE Transactions on Nuclear Science, Vol. NS 22, February 1975, pages 446–451 describes an analog-to-digital converter of the type defined above which comprises a folding circuit wherein the input signal is applied to the bases of a first and a second transistor. Each emitter of the first and the second transistor is connected to an emitter of one of two other transistors the bases of which being connected to a somewhat different reference voltage. Such a folding circuit has an input signal-output signal characteristic which greatly deviates from the desired triangular shape. A slight improvement thereof is possible by the use of logarithmic load resistors.

SUMMARY OF THE INVENTION

The invention has for its object to improve the triangular shape of the output signal.

According to the invention a folding circuit for an analog-to-digital converter of the type defined in the preamble is characterized in that the input signal is applied in operation to the emitter of the first transistor by a current source while the emitter of the second transistor is coupled to the emitter of the first transistor via a threshold element and the bases of the first and the second transistors are coupled to such d.c. voltages that in operation the difference between them is smaller than the threshold voltage of the threshold element.

These measures improve the waveform of the output signal itself so that the whole of each side of the triangular waveform can be used for a fine converter if a coarse converter is coupled to the input of the circuit. Therefore, if so desired, the use of a further folding circuit in a sub group which supplies an undistorted output signal whereas the output signal of the first-mentioned folding circuit, which then constitutes another sub group, is destorted, can be avoided.

Analog-to-digital converters according to the invention are particularly suitable to convert signals having a large bandwidth, such as, for example, videosignals.

DESCRIPTION OF THE DRAWINGS

The invention will now be further explained with reference to the drawings.

In the drawing.

DESCRIPTION OF THE PREFERRED EMBODIMENTS

Figure 1:
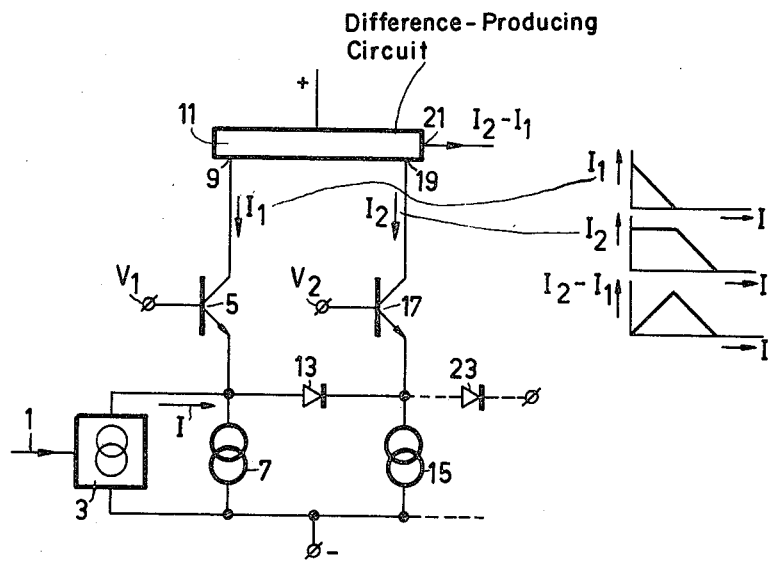
FIG. 1 illustrates a single folding circuit for an analog-to-digital converter according to the invention.

In FIG. 1 an input signal is applied to an input 1. This input signal controls a current source 3 which supplies a current I proportional to the instantaneous value of the input signal.

The current I is applied to the junction of the emitter of a first transistor 5, whose base is connected to a fixed potential $V_1$, and to a first direct current source 7 which discharges a constant direct current from this junction. The collector of the first transistor 5 is connected to an input 9 of a difference-producing circuit 11.

Via a diode 13 the junction of the emitter of the first transistor 5 and the first direct current source 7 is connected to the junction of a second direct current source 15 and the emitter of a second transistor 17 whose base is connected to a fixed potential $V_2$. The second direct current source 15 discharges a constant direct current from this junction. The collector of the second transistor is connected to an input 19 of the difference-producing circuit 11 which has an output 21 from which the difference $(I_2 - I_1)$ between the collector current $I_2$ of the second transistor 17 and the collector current $I_1$ of the first transistor can be taken off.

The voltage difference between $V_1$ and $V_2$ at the base of the first and the second transistors 5 and 17, respectively, is so that the diode 13 is inhibited when the current I, supplied by the current source 3 is of a low value. The diode 13 serves as a threshold element and does not conduct until the current I becomes larger than the current discharged by the first direct current source 7. When the value of the current supplied by the current source 3 increases from a value zero the current $I_2$ through the second transistor remains constant and the current $I_1$ through the first transistor 5 will decrease from a value, determined by the first current source 7 to zero. The first transistor 5 is then cutoff and the voltage at the emitter of the first transistor 5 will continue to increase until the threshold voltage of the diode 13 is exceeded. When the value of the current I continues to increase the current $I_2$ through the second transistor 17 will now also start to decrease. The difference between the currents $I_2$ and $I_1$ occurring at the output 21 of the difference-producing circuit 11 will have, as a function of the current I, a triangular waveform having very linear sides and a sharp peak.

The difference-producing circuit 11 may be of a construction as described in U.S. Pat. No. 3,697,882 and can then control a next folding circuit. It is alternatively possible to include a resistor in each of the collectors of the transistors 5 and 17 and to use, as the difference-producing circuit, a fine converter which is connected between these collectors as will be explained in further detail in the description of FIG. 4.

The voltage jump produced at the emitter of the first transistor 5 when the current I exceeds the value of the direct current supplied by the direct current source 7 can be used for a coarse conversion. This voltage jump is either equal to the threshold voltage of the diode 13 if the voltages $V_2$ and $V_1$ at the bases of the first and the second transistor are equal, larger than that threshold voltage if $V_2$ is higher than $V_1$ or smaller if $V_2$ is lower than $V_1$. In the latter case measures must be taken to ensure that $V_1-V_2$ remains below the threshold voltage of the diode 13.

If so desired the diode 13 can be replaced by another threshold element such as, for example, a Schottky diode or a diode connected between an input and an output of an amplifier.

If so desired, the junction of the emitter of the second transistor 17 and the direct current source 15 can be connected to one of the voltages $V_1$ or $V_2$ via an additional diode circuit 23, which is shown in the drawing by means of a dotted line, to prevent the voltage at the emitters of the first and the second transistors 5 and 17 from becoming too high at a value of I which exceeds the sum of the direct currents supplied by the sources 7 and 15.

Figure 2:
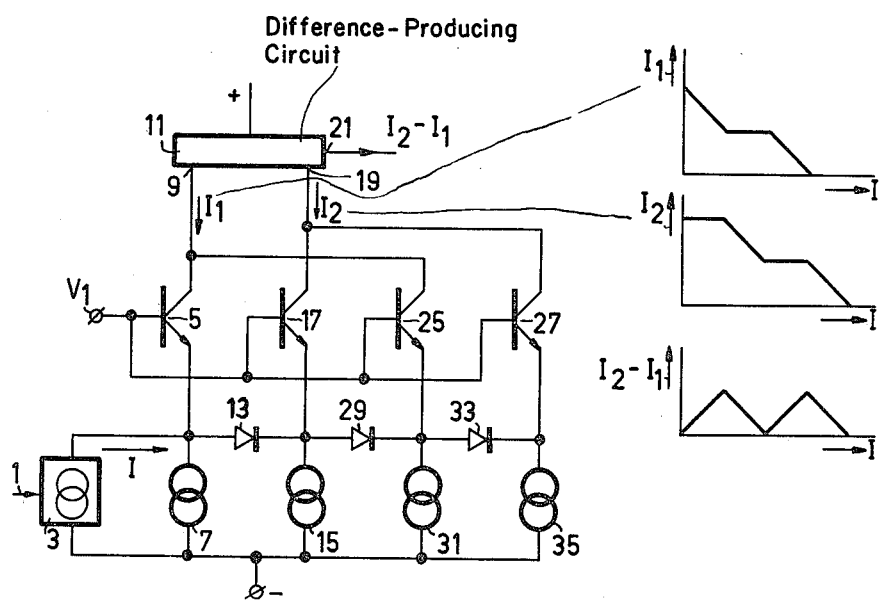
FIG. 2 illustrates a multiple folding circuit for an analog-to-digital converter according to the invention.

FIG. 2 shows a folding circuit which folds a plurality of times. Elements corresponding to those shown in FIG. 1 have been given the same reference numerals. For their description reference is made to the description of FIG. 1.

The collector of the first transistor 5 is connected to the collector of a third transistor 25 and the collector of the second transistor 17 is connected to the collector of a fourth transistor 27. The bases of all transistors 5, 17, 25 and 27 are connected to a voltage $V_1$. The emitter of the second transistor 17 is connected to the junction of the emitter of the third transistor 25 and a direct current source 31 through a diode 29. The emitter of the third transistor 25 is connected to the junction of the emitter of the fourth transistor 27 and a direct current source 35 through a diode 33. Each one of the direct current sources 31 and 35 discharges a constant direct current from the relevant junctions.

For a value of I increasing from zero $I_1$ will first decrease until the first transistor 5 is cutoff, then the diode 13 starts conducting and thereafter the current $I_2$ decreases until the diode 29 becomes conductive. Then the current $I_1$ decreases again until diode 33 starts conducting and thereafter the current $I_2$ decreases again if I continues to increase.

It will be clear, that if more triangles are desired, the circuit can be extended by means of additional direct current sources and transistors, which can be arranged behind the folding circuit of the drawing.

Figure 3:
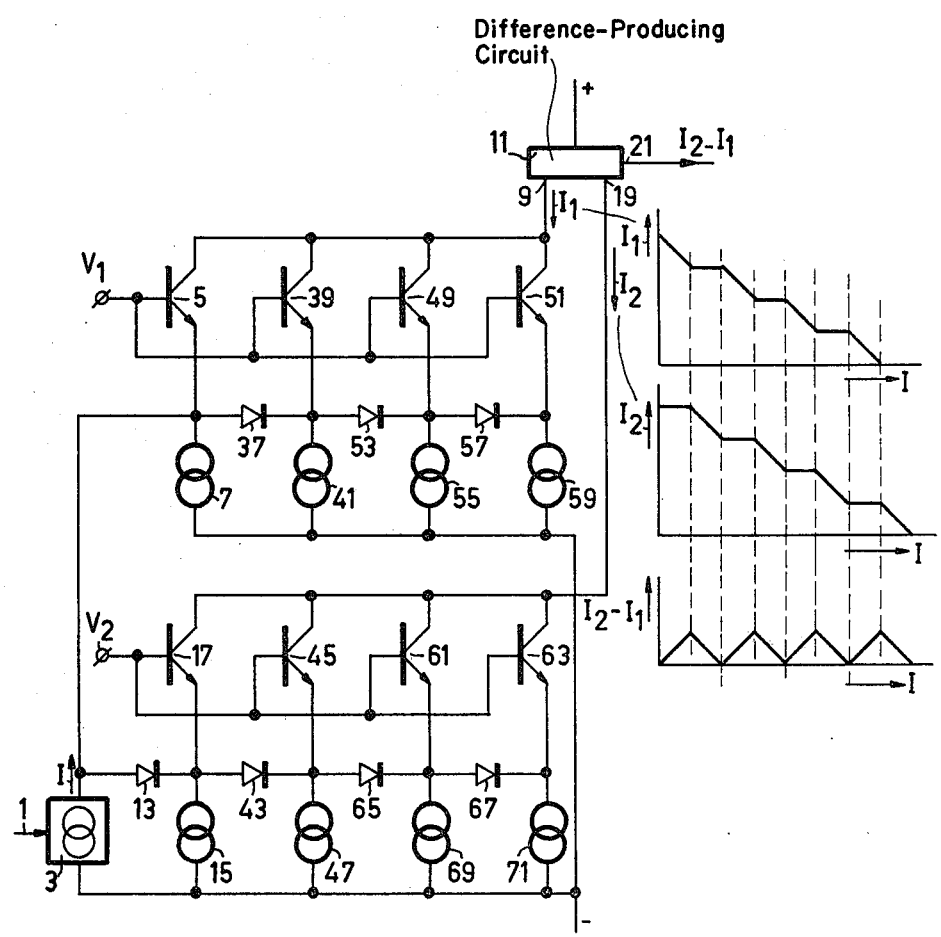
FIG. 3 illustrates a further multiple folding circuit for an analog-to-digital converter according to the invention.

FIG. 3 shows a multiple folding circuit which, with respect to the folding circuit of FIG. 2 has the advantage that the emitter-base voltage of the transistors does not increase to such a high extent. The elements corresponding to elements in FIG. 1 have been given the same reference numerals. For their description reference is made to the description of FIG. 1.

The voltage $V_2$ at the base of the second transistor 17 is chosen lower than the voltage $V_1$ at the base of the first transistor 7, for example half the value of the threshold voltage of the diode 13 or lower.

Through a diode 37 the emitter of the first transistor 5 is connected to the junction of the emitter of a third transistor 39 and a third direct current source 41 which drains a predetermined direct current from this junction. The collector of the third transistor 39 is connected to the collector of the first transistor 5.

Through a diode 43 the emitter of the second transistor 17 is connected to the junction of the emitter of a fourth transistor 45 and a fourth direct current source 47, which drains a predetermined direct current from this junction. The collector of the fourth transistor 45 is connected to the collector of the second transistor 17.

Connected to the collectors of the first and the third transistors 5 and 39, respectively, are the collectors of a fifth and a sixth transistor 49 and 51, respectively, the emitters of which are connected to a chain of diode-direct current source circuits 53, 55, 57, 59. The bases of the first, third, fourth and fifth transistors (5, 39, 49, 51) are interconnected.

Connected to the collector of the second and fourth transistors 17 and 45, respectively, are the collectors of a seventh and an eighth transistor 61 and 63, respectively, the emitters of which are connected to the junctions of diodes 65 and 67, respectively, and direct current sources 69 and 71, respectively. The bases of these seventh and eighth transistors 61, 63 are connected to the bases of the second and the fourth transistors 17, 45.

When the current I produced by the current source 3 increases, the transistors 5 and 17, 39, 45, 49, 61, 51 and 63, respectively, are successively cutoff. The difference value $(I_2-I_1)$ of the currents $I_2$, supplied to the lower group of transistors 17, 45, 61, 63, and $I_1$, supplied to the upper group, has a triangular waveform. The highest emitter voltage occurring when the folding circuit is fully excited is now less than four times the threshold voltage of a diode. For a multiple folding circuit implemented according to the principle of FIG. 2 this would have been seven times the threshold voltage of a diode.

Figure 4:
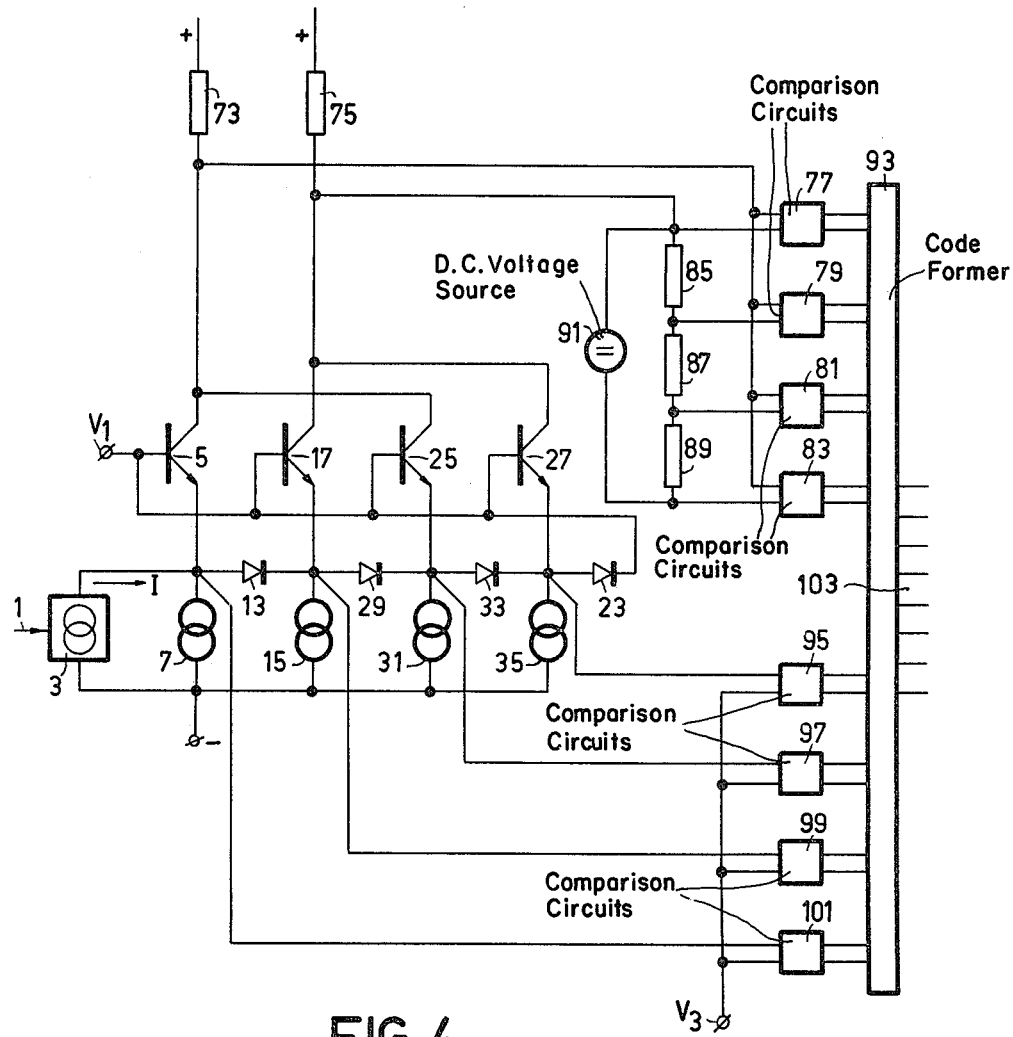
FIG. 4 illustrates by means of a simplified circuit diagram an analog-to-digital converter according to the invention.

In FIG. 4 elements corresponding to those in FIG. 2 and FIG. 1 has been given the same reference numerals. For their description reference is made to the description of these Figures.

The collectors of the first and the third transistors 5, 25 are connected to a positive voltage through a resistor 73, the collectors of the second and the fourth transistors 17, 27 through a resistor 75. In addition, an input of each one of a group of comparison circuits 77, 79, 81, 83 is connected to the resistor 73. Another input of the comparison circuit 77, 79, 81, 83 is connected to a voltage divider 85, 87, 89 which has one end connected to the resistor 75 and to a floating d.c. voltage source 91 and its other end to the other terminal of the d.c. voltage source 91. When the common collector currents pass through one side of the triangle, the polarities of the output voltages of the comparison circuits change consecutively. These output voltages are converted into a desired code in a code former 93.

The output voltages of four comparison circuits 95, 97, 99, 101 are also applied to this code former 93, an input of these comparison circuits being connected to a suitably chosen voltage $V_3$ and another input being connected to one of the emitters of the transistors.

The code former 93 has a plurality of outputs 103 from which the digital code which corresponds to the analog value of the input signal at the input 1 can be taken off.

The comparison circuits can, for example, be of the type used in the converters described in the abovementioned article in IEEE transaction on Nuclear Science or of the U.S. Pat. No. 3,735,390.

Although generally the use of sub-groups will not be necessary in view of the proper linearity of the triangular waveform and the sharp bends therein, they may be used, if so desired, for which two groups as shown in FIG. 2 can be taken, each being controlled by a current source which is controlled by the input signal and whose direct current sources in the emitter circuits of the first transistors in the groups produce currents of a different value.

The direct current sources in the emitter circuits of the transistors of the circuits shown in the Figures determine the type of the conversion. When the direct current sources of a given folding circuit receive an equal current value, the conversion is linear. For a conversion which must be non-linear the current received by the direct current source must be chosen in a suitable ratio. When a coarse-to-fine converter is used, as shown in FIG. 4, wherein the coarse conversion is effected in the emitter circuits of the transistors and the fine conversion in the collector circuits, the voltage divider 85, 87, 89 must also be adapted for a non-linear conversion and the collector circuits of the transistors can be connected to suitably chosen taps of the collector resistors 73 and 75.

It will be clear that for a different polarity of the currents produced by the input current source transistors of the opposite conductivity type can be used and that the diodes must be connected in the opposite direction, whereas the direct current sources must produce a current of opposite polarity.

It is of course also possible to make a combination of converters which are suitable for negative and for positive input currents by coupling chains for each of those polarities to one another.

A converter according to the invention is particularly suitable to convert video signals in television systems although it is not limited to this use.

What is claimed is:

1. A folding circuit for an analog-to-digital converter for converting an input signal monotonously changing in a first direction, up to a certain value, into an output signal monotonously changing in said first direction and, above said certain value, into an output signal monotonously changing in a second direction, said second direction being opposite to said first direction, the folding circuit comprising a first and a second transistor to which the input signal is applied, a first and a second current source connected respectively to the emitters of said first and second transistors, and a difference-producing circuit connected to the collectors of said first and second transistors from which said output signals are obtained, characterized in that said folding circuit further comprises an input current source coupled to the emitter of said first transistor, to which said input signal is applied, for supplying a current proportional to the instantaneous value of said input signal, a threshold element coupled between the emitters of said first and second transistors, and means for applying a first and a second d.c. voltage respectively to the bases of said first and second transistors, whereby the voltage difference between said first and second d.c. voltages is smaller than the threshold voltage of said threshold element.

* * * * *